United States Patent
Park et al.

(10) Patent No.: US 7,897,198 B1
(45) Date of Patent: Mar. 1, 2011

(54) ELECTROLESS LAYER PLATING PROCESS AND APPARATUS

(75) Inventors: Heung L. Park, Wilsonville, OR (US); Eric G. Webb, Salem, OR (US); Jonathan D. Reid, Sherwood, CA (US); Timothy Patrick Cleary, Portland, OR (US)

(73) Assignee: Novellus Systems, Inc., San Jose, CA (US)

(*) Notice: Subject to any disclaimer, the term of this patent is extended or adjusted under 35 U.S.C. 154(b) by 1449 days.

(21) Appl. No.: 10/235,420

(22) Filed: Sep. 3, 2002

(51) Int. Cl.
C23C 18/31 (2006.01)
C23C 18/34 (2006.01)
C23C 18/36 (2006.01)
C23C 18/40 (2006.01)
H01L 21/44 (2006.01)

(52) U.S. Cl. ........ 427/97.1; 427/98.6; 427/99.1; 427/99.5; 427/265; 427/304; 427/305; 427/437; 427/438; 427/443.1; 438/678; 438/653; 438/656; 438/685; 438/687

(58) Field of Classification Search .......... 427/404, 427/405, 304, 305, 58, 98, 123; 438/678
See application file for complete search history.

(56) References Cited

U.S. PATENT DOCUMENTS

| | | | |
|---|---|---|---|
| 4,002,778 A * | 1/1977 | Bellis et al. ............ 427/98 |
| 4,031,291 A * | 6/1977 | Fullenwider ............ 429/40 |
| 4,364,803 A * | 12/1982 | Nidola et al. .......... 205/161 |
| 4,981,725 A * | 1/1991 | Nuzzi et al. ............ 427/304 |
| 5,151,168 A | 9/1992 | Gilton et al. |
| 5,318,803 A * | 6/1994 | Bickford et al. ........ 427/306 |
| 5,382,447 A * | 1/1995 | Kaja et al. ............ 427/126.6 |
| 5,576,052 A | 11/1996 | Arledge et al. |
| 5,674,787 A | 10/1997 | Zhao et al. |
| 5,824,599 A | 10/1998 | Shacham-Diamond et al. |
| 5,891,513 A | 4/1999 | Dubin et al. |
| 5,913,147 A | 6/1999 | Dubin et al. |
| 5,969,422 A | 10/1999 | Ting et al. |
| 5,972,192 A | 10/1999 | Dubin et al. |
| 6,065,424 A | 5/2000 | Shacham-Diamond et al. |
| 6,136,707 A | 10/2000 | Cohen |
| 6,174,353 B1 * | 1/2001 | Yuan et al. .......... 106/1.11 |

(Continued)

FOREIGN PATENT DOCUMENTS

JP 02-111883 A * 4/1990

(Continued)

OTHER PUBLICATIONS

Andryuschenko et al., "Electroless and Electrolytic Seed Repair Effects on Damascene Feature Fill," Proceedings of International Interconnect Tech. Conf., San Francisco Ca., Jun. 4-6, 2001, pp. 33-35.

(Continued)

Primary Examiner—Katherine A Bareford
(74) Attorney, Agent, or Firm—Weaver Austin Villeneuve & Sampson LLP

(57) ABSTRACT

Electroless plating is performed to deposit conductive materials on work pieces such as partially fabricated integrated circuits. Components of an electroless plating bath are separately applied to a work piece by spin coating to produce a very thin conductive layer (in the range of a few hundred angstroms). The components are typically a reducing agent and a metal source.

23 Claims, 3 Drawing Sheets

U.S. PATENT DOCUMENTS

| | | | |
|---|---|---|---|
| 6,194,032 B1 * | 2/2001 | Svedberg et al. | 427/466 |
| 6,197,181 B1 | 3/2001 | Chen | |
| 6,257,732 B1 * | 7/2001 | Takahagi et al. | 359/883 |
| 6,398,855 B1 * | 6/2002 | Palmans et al. | 106/1.23 |
| 2003/0059538 A1 * | 3/2003 | Chung et al. | 427/304 |

FOREIGN PATENT DOCUMENTS

| | | |
|---|---|---|
| WO | 99/47731 | 9/1999 |

OTHER PUBLICATIONS

Chen et al., "EDC Seed Layer for Inlaid Copper Metallisation," Semiconductor Fabtech—12$^{th}$ Edition, 5 Pages, Jul. 2000.

Ken M. Takahasi, "Electroplating Copper into Resistive Barrier Films," Journal of the Electrochemical Society, 147 (4) 1417-1417 (2000).

T.P. Moffat et al., "Superconformal Electrodeposition of Copper in 500-90 nm Features," Journal of the Electrochemical Society, 147 (12) 4524-4535 (2000).

Ritzdorf et al., "Electrochemically Deposited Copper," Conference Proceedings ULSI XV 2000, Materials Research Society, 101-107.

Reid et al., "Optimization of Damascene Feature Fill for Copper Electroplating Process," Shipley Company, ITTC 1999, 3 Pages.

Reid et al., "Copper PVD and Electroplating," Solid State Technology, Jul. 2000, www.solid-state.com, 86-103.

Reid et al., "Factors Influencing Fill of IC Features Using Electroplated Copper," Adv Met Conf Proc 1999, MRS 10 Pages, (2000).

Shacham-Diamond et al., "Copper Electroless Deposition Technology for Ultr-Large-Scale-Integration (ULSI) Metallization," Microelectronic Engineering 33 (1997) 47-58.

* cited by examiner

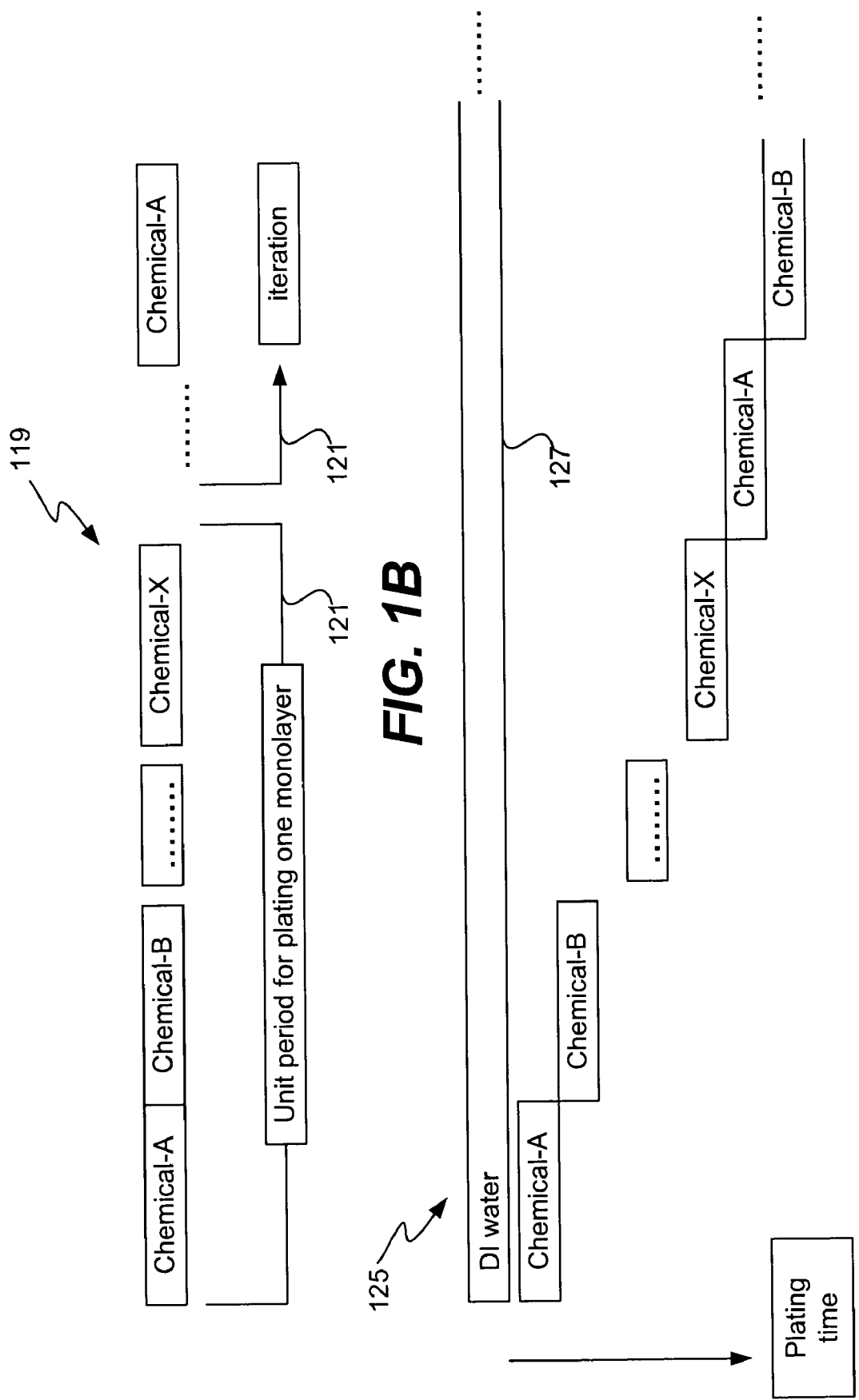

ELECTROLESS LAYER PLATING PROCESS AND APPARATUS

CROSS-REFERENCE TO RELATED APPLICATIONS

This application is related to U.S. patent application Ser. No. 09/996,425, filed Nov. 27, 2001, now U.S. Pat. No. 6,664,122, titled "ELECTROLESS COPPER DEPOSITION METHOD FOR PREPARING COPPER SEED LAYERS," and naming T. Andryuschenko, J. Reid, S. Mayer, and E. Webb as inventors. That application is incorporated herein by reference for all purposes.

BACKGROUND

This invention pertains to electroless plating of conductive materials on work pieces (or "substrates") such as partially fabricated integrated circuits. More particularly, the invention pertains to spin plating electroless deposition of very thin conductive layers (in the range of a few hundred angstroms).

Various unit processes are available for plating thin metallic layers such as seed layers (used as a conductive coating for electrodeposition of copper). These processes include chemical vapor deposition (CVD), electroplating, physical vapor deposition (PVD), and electroless plating. In many ways electroless plating is an attractive choice. It has a lower cost than electroplating. It has excellent step coverage (better than at least PVD). And it allows for selective deposition on regions of different chemical or structural composition on the substrate.

Because of these advantages, various groups are actively researching certain applications for electroless plating. These include repairing PVD (physical vapor deposition) seed layers, forming thin seed and barrier layers, and capping layers for copper lines. Regarding seed layer repair, seed layers are typically formed by PVD. But as device geometries shrink, the step coverage of PVD begins to fail to the point where copper incompletely covers the bottoms of the contact holes in Damascene structures. Electroless plating can repair the incomplete PVD seed layer by depositing copper on inadequately covered regions of Damascene structures.

In a second application, electroless plating provides a metallic barrier layer that serves a dual role as a seed layer. In one example, electroless plating deposits a layer of metallic cobalt that blocks diffusion of copper into surrounding dielectric and serves as a seed layer for the subsequent electrodeposition of copper.

Finally, electroless plating may form a "capping layer" that reduces or eliminates copper electromigration from an underlying metal layer to a diffusion barrier deposited on the dielectric layer of the next higher metallization layer. Electromigration is known to be a particular problem at the interface of a copper line in lower metallization layer and a porous diffusion barrier in the next higher metallization layer. A thin metal capping layer interposed between the diffusion barrier and copper line addresses this problem. Electroless plating of an appropriate metal layer such as a cobalt layer can provide effective capping.

While research in electroless plating for these applications is proceeding and new advances are occurring rapidly, certain difficulties remain. For example, it can be difficult to accurately control the thickness of the deposited layer, particularly when very thin layers are employed (on the order of tens or hundreds of angstroms). Further, metal layers formed by electroless deposition are frequently of poor quality. Electroless deposition is essentially a two step process: nucleation and bulk growth. Nucleation is the rate limiting step. To promote nucleation, conventional electroless processes employ plating solutions having very high reactant concentrations. While this addresses the issue of nucleation, it can introduce a different problem during the bulk growth phase. For once the growth phase begins it proceeds very rapidly due to the high reactant concentrations. The rapid deposition results in relatively high rates of defects such as dislocations. Further, it can cause impurities such as chloride ions and carbon to incorporate in the metal layer. These impurities originate with the anions, complexing agents, surfactants, etc. in the plating solution.

Thus, while electroless processes appear to be an attractive candidates for next generation IC fabrication processes, certain problems remain to be solved.

SUMMARY

The present invention addresses the problems identified above by carefully controlling the amount of bulk growth. It accomplishes this with a sequential electroless plating process and associated apparatus to build up plated layers sequentially, often one atomic layer at a time on a substrate surface. The process is analogous to gas phase atomic layer deposition processes and epitaxial processes. Hence, the film quality is very good.

Note that electroless plating requires at least a source of metal (usually a soluble metal salt) and a reducing agent for reducing metal ions from the source of metal to elemental metal at the substrate surface. The invention provides a sequential application of a solution of reducing agent and a solution the metal source. These components can be applied in either order. The first component adsorbs on the substrate surface. The excess solution drains or otherwise departs from the substrate surface. Hence there is a limited amount of this material available for reaction when the second component contacts the surface. The second component stoichiometrically reacts with the first at the substrate surface. Hence a very thin metal layer forms—on the order of one atomic layer. To build up a metal layer of appropriate thickness, the sequential application of reducing agent and metal source repeats over multiple cycles—with each cycle generating an additional thin layer (sometimes a monolayer).

One specific aspect of the invention pertains to methods of forming a metal layer on a substrate surface. Such methods may be characterized by the following sequence: (a) contacting the substrate surface with a reducing agent solution; and (b) contacting the substrate surface with a metal ion solution. In this method, the reducing agent solution comprises insufficient metal ion to permit electroless plating of the metal. The reducing agent solution contacts the substrate surface in a manner causing a limited amount (e.g., a saturated layer) of reducing agent to adsorb to the substrate surface. In addition, the metal ion solution comprises insufficient reducing agent to permit electroless plating of the metal. Thus, the metal ion reacts with the reducing agent at the substrate surface to electrolessly plate the metal on the substrate surface.

Often the electroless deposition reaction of this invention will take place over multiple cycles. Thus, for example, the above sequence may require repeating (a) and (b) to plate additional metal on the substrate surface. In such cases, the individual deposition cycles may involve depositing the same metal from cycle to cycle or different metals in different cycles. Thus, for example, a cobalt-nickel composition may be desposited.

In some embodiments, the reducing agent solution includes one or more of the following reducing agents: glyoxylic acid, formaldehyde, hydrazine, dimethylamino borane, and ammonium hypophosphite. Preferably, reducing agent is present in a concentration ranging from between about 0.01 M to about 0.2 M. Some specific examples of metal ion/reducing agent combinations include (1) copper ion and glyoxylic acid and/or formaldehyde and (2) cobalt ion and hydrazine, dimethylamineborane, and/or hypophosphite.

Examples of metal ions that may be used with this invention include cobalt, copper, nickel, and combinations thereof. In certain specific embodiments, the metal ion solution comprises metal ions in a concentration of between about 0.01 M and 0.5 M. The amount of metal ion reacting with the reducing agent on the substrate surface is limited to by the amount of reducing agent present on the surface. In one example, the method electrolessly plates a monolayer of the metal on the substrate surface.

One important application of the present invention is in depositing thin metal layers on partially fabricated semiconductor substrates, particularly those having a principal dimension of at most about 1 micrometer. The metal layer formed by this process may comprise a seed layer for a Damascene structure. Or it may comprise a barrier-seed layer. Still further, the metal layer may comprise a capping layer provided on top of a copper or aluminum conductive line. In such cases, the capping layer preferably comprises one or more of the following materials: Co, CoP, CoB, CoBP, CoBPW, CoWP, Ni, NiP, and NiPW.

The sequence operations for metal deposition can be performed in any order. In other words, the metal ion solution can contact the substrate surface first, or the reducing agent can contact the surface first. In the former case, the metal ions adsorbed on the surface are subsequently reduced by subsequent contact with the reducing agent solution. One way to characterize this approach is as follows: (a) deliver a metal source solution to the substrate surface to cause said metal source to adsorb to the substrate surface; (b) stopping or reducing delivery of the metal source solution to the substrate surface; and (c) delivering a reducing agent solution to the substrate surface. The reducing agent reacts with the adsorbed metal source at the substrate surface to electrolessly plate the metal on the substrate surface.

Another aspect of the invention pertains to electroless plating apparatus. Such apparatus may be characterized by the following features: (a) a substrate holder for positioning a substrate such that a substrate surface can receive solutions necessary for electroless plating of a metal layer; (b) one or more delivery mechanisms for providing separate solutions of (i) a reducing agent solution, and (ii) a metal ion solution to the substrate surface; and (c) a control system designed or configured to cause delivery of the reducing agent solution to the substrate surface separately from delivery of the metal ion solution to the substrate surface. In one example, the delivery mechanisms comprise injection nozzles.

These and additional features and advantages of the invention will be described in detail below with reference to the associated drawings.

BRIEF DESCRIPTION OF THE DRAWINGS

FIG. 1B is a diagram schematically depicting multiple iterations of a sequential electroless deposition process in accordance with an embodiment of this invention.

FIG. 1C is a diagram schematically depicting multiple iterations of a sequential electroless deposition process in which additional "wetting" is required.

DETAILED DESCRIPTION

Overview

The present invention provides various features that improve electroless deposition. As one feature, the reducing agent and metal source separately contact the substrate. While there may be some overlap in time when the substrate is concurrently contacted by both reducing agent and metal source, there will be other times when only one of the two components contacts the substrate. This general process will be referred to herein as "sequential electroless deposition." As another feature, the deposition process takes place over multiple cycles, each of which deposits some fraction of the total thickness of the deposited layer. In an important embodiment, that per cycle fraction is a monolayer of the deposited material. As another aspect, the invention may be implemented in a spin coating apparatus, where the substrate spins during application of the reducing agent, metal source, and/or other processing liquid.

To implement a sequential electroless deposition, one can consider certain processing issues—particularly in the context of depositing on deep sub-micron features in semiconductor manufacturing processes. These issues include (1) process control (repeatable and accurate control of the unit process in conjunction with tight control of solution parameters (such as concentrations and temperatures)) to allow plating of very thin metallic films, (2) materials properties (formation of a dense crystal structure having a low level of crystal defects and impurities), and (3) equipment design (simple and inexpensive with flexible configuration to allow application of different solutions such as electroless plating solutions, surface cleaning solutions, surface activation solutions, and rinse solutions). With these goals in mind, the electroless plating process and equipment of the present invention will now be described.

Figure 1A:
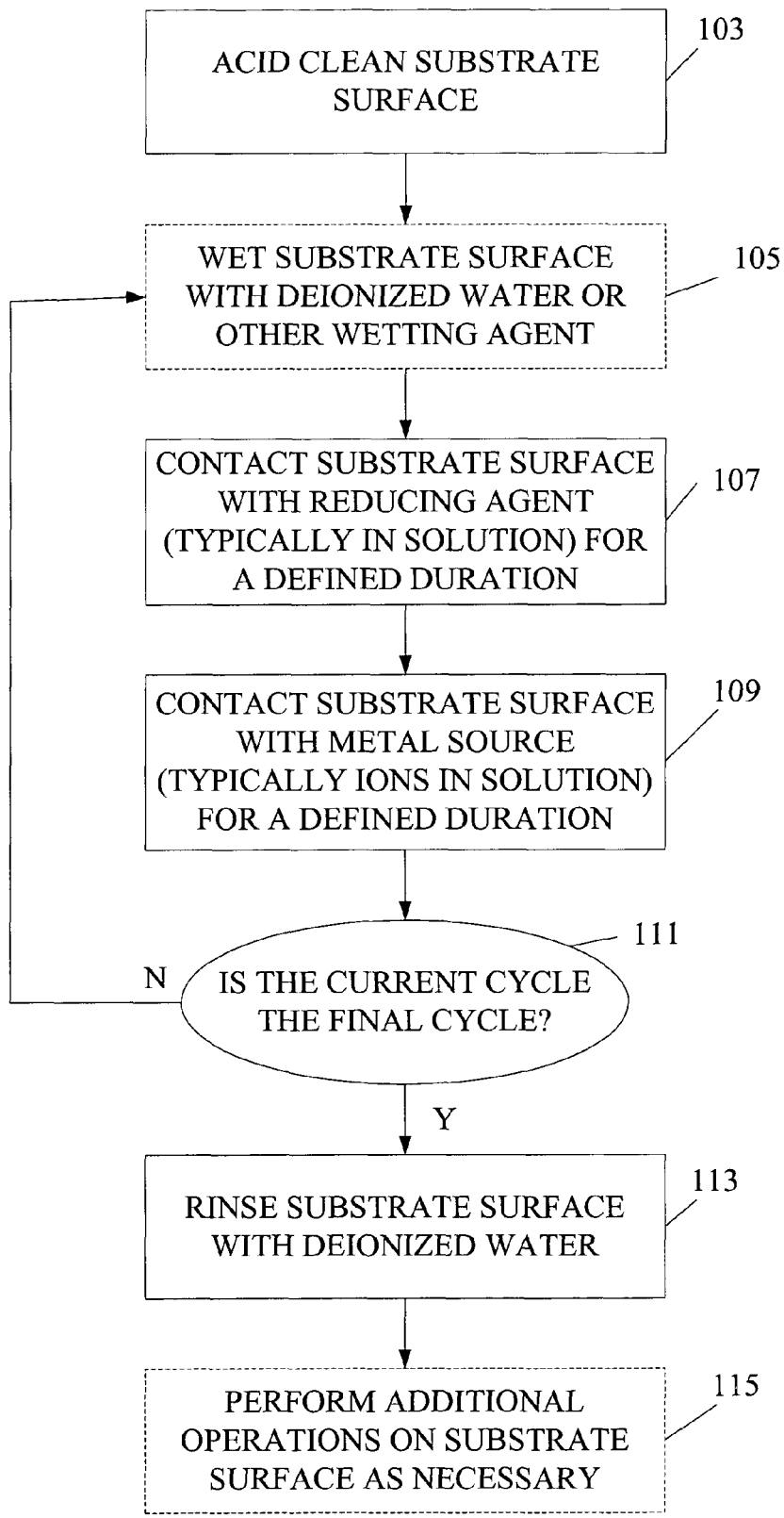
FIG. 1A is a process flow chart depicting a general sequence of operations for a sequential electroless deposition in accordance with one embodiment of this invention.

FIG. 1A depicts a complete process flow of this invention—presented in the context of a larger IC fabrication technology. The presented example is suitable for thin layer cobalt deposition, thin layer copper deposition, or thin layer nickel deposition. With minor variation, it can be applied to deposit other thin layers of virtually any conductive material on virtually any substrate surface.

As depicted at process block 103 of FIG. 1A, the process begins with the apparatus cleaning the substrate surface with a dilute acid such as sulfuric acid to clean off organic residues or other surface debris resulting from earlier unit processes. Such residues may arise from etching, chemical mechanical polishing, earlier deposition operations, etc.

Then, optionally, at process block 105, the plating apparatus applies deionized water to the substrate surface (e.g., through an injection nozzle or other port) to ensure adequate surface wetting. Some dielectric materials such as silicon carbide are not easily wetted. The same is true of other low-k dielectrics, which may contain organic polymers and/or fluorine-containing moieties and/or be relatively porous. In some embodiments, the water may include a surfactant such as PEG, PPG, triton X-100, RE610, etc. to improve wettability.

Preferably, the fluid delivered in process operation 105 is delivered at a substantially constant flow rate and pressure over the course of the sequential deposition (including application of reducing agent and metal source delivery; see FIG. 1C discussed below). This will maintain the surface at a constant fluid dynamic state. If the invention is practiced in this manner, the water may be delivered together with the reducing agent and/or metal source, through the same delivery mechanism used for either of these reactants, or through a separate dedicated delivery mechanism.

At process block 107, a solution of the reducing agent is delivered to the substrate surface under conditions whereby a relatively small quantity of reducing agent (e.g., a monolayer) is adsorbed on the substrate surface. The solution may be delivered at a substantially constant flow rate and pressure via an injection nozzle or other suitable mechanism. It may also be delivered with or without a pH-adjusting chemical. The flow rate and delivery time should be chosen to ensure that a significant quantity of reducing agent is adsorbed on the substrate surface. In some embodiments, the reducing agent solution will be applied for a period of between about 1 and 60 seconds.

Next, at process block 109, a solution of the metal source is delivered to the substrate surface under conditions that allow it react with the adsorbed reducing agent. During this stage, metal ions contact the substrate surface and there react with reducing agent to consummate the plating process. This process may take place in a manner that forms only a monolayer of film. As with the reducing agent, the flow rate and delivery time of the metal source should be chosen to provide a quantity of metal ion sufficient to react with all adsorbed reducing agent. In some embodiments, the metal source solution will be applied for a period of between about 1 and 60 seconds.

The metal source may be provided with a complexing agent, such as citrate or ammonia in the case of a cobalt metal source (or EDTA or pyrophosphate in the case of copper), to prevent precipitation of the metal hydroxide. As indicated, the metal source solution may be delivered through the same mechanism as the deionized water (together with it) or delivered separately.

In preferred embodiments, the reducing agent and/or metal source is deposited on the substrate as a "saturated layer" or "monolayer." Generally, a monolayer refers to the amount of chemical compound occupying all or nearly all the available sites on the substrate surface—but not significantly more. Any bulk or excess reactant is rinsed off, drained, or otherwise removed from the substrate surface. Generally, the amount is limited by adsorption to the substrate surface. It includes not only the situation where exactly all sites are occupied but no extra, but where somewhat less or more material is adsorbed on the substrate surface.

As indicated, the full deposition process typically requires multiple cycles of reducing agent and metal source. If the final deposition cycle has completed, then the electroless plating process stops, as indicated at decision 111 of the FIG. 1A flow chart. If one or more additional layers are to be deposited, however, then the process branches back to operation 105, where deionized water is directed onto the substrate surface—assuming that this option procedure is employed. Note that this usually means that the deionized water flows continuously, without stopping, between and during deposition cycles. Decision 111 is typically implemented with a control system that counts the number of deposition cycles. When a predetermined number of cycles have passed, the control system instructs the apparatus to go no farther with electroless deposition. This control feature is based on an assumption that each cycle deposits a certain thickness of metal and after a certain number of such cycles the total deposited metal thickness has reached the desired level. In an alternative embodiment the exact number of cycles is undefined at the beginning of the process. Instead the apparatus includes a monitoring component that detects the deposited metal thickness (directly or indirectly) and feeds this information to a control system. Using this information, the control system determines when to stop further deposition cycles. The monitoring component preferably employs a non-invasive technique such as an electrical measurement (e.g., conductivity) or an optical measurement (e.g., wavelength or angle of incidence dependent reflectivity—X-ray or visible).

At the end of the overall process, or optionally at the end of each cycle, the substrate is rinsed with deionized water (without concurrently contacting it with metal source or reducing agent). If deionized water is applied during application of reducing agent and metal source, the process simply continues to apply the deionized water after the metal source delivery operation ends. The deionized water serves to remove excess chemical residues before proceeding with subsequent processing. See process block 113 of FIG. 1A. After rinsing, the substrate is processed further if necessary to complete IC fabrication or whatever other processing is dictated by the particular application at hand. See process block 115. Subsequent processing steps are not central to this invention. If IC fabrication is the ultimate application, then the subsequent steps may involve copper electrodeposition, dielectric deposition, etc.

Note that the processes of this invention may plate composite materials (including multiple distinct metals) when using multiple metal sources. For example, alternate passes through the cycle of operations 107 and 109 may employ a second, different, metal source at process block 109. This allows alternating monolayers of metal to plate to produce a layered structure. Of course, the schedule of cycles employing first, second, and possibly additional metal sources can be adjusted and tailored to create various exotic conductive materials.

Note also that FIG. 1A shows the reducing agent being applied prior to the source of metal. However, the invention is not limited to this order. The source of metal can be applied prior to the reducing agent. Of course, some applications may favor a particular order. For example, if the underlying substrate surface is susceptible to oxidation under the reaction conditions—or the deposited layer itself is similarly susceptible—then the reducing agent should be applied first to reduce surface oxides or prevent them from forming.

A sequential electroless deposition process such as the one outlined above offers various advantages over conventional electroless deposition processes. One advantage is suppression of homogeneous solution phase reaction between reducing agent and metal source. Suppression occurs because the reactants are not mixed during the plating process. Another advantage is improved selectivity in the deposition process. Selective plating processes plate metal on some exposed materials but not others. Selectivity is superior with sequential electroless deposition because any reaction byproducts are removed from the substrate surface immediately after generation. More specifically, byproducts such as carbon containing materials can adhere to the non-conductive regions of the substrate (e.g., oxide regions) and support nucleation of a metal there. Thereafter the electroless deposition extends onto the non-conductive regions. And, as mentioned, sequential electroless deposition allows better control of the deposition process and consequently provides higher quality deposited layers.

FIG. 1B schematically depicts a multi-cycle sequential electroless deposition procedure 119, with time varying in the horizontal direction. Each cycle 121 requires sequential contact of Chemical-A, then Chemical-B . . . and Chemical-X contacting the substrate surface. After completing one cycle (of unit period in length), the next iteration begins. Each unit period plates one monolayer of metal.

FIG. 1C schematically depicts a similar multi-cycle deposition procedure 125, but with deionized water 127 consistently delivered to the substrate surface over the course of the deposition. In this depiction, time varies in the vertical direction and different chemical solutions are separated from one another along both the horizontal and vertical directions.

Parameters

1. Solutions

Various parameters come into play in this invention. These include the physical and chemical properties of the individual solutions used in the sequential electroless deposition process. They also include the properties of the deposited films and the conditions under which the reactants and other components are delivered to the substrate.

Regarding the metal source solution, it must contain a precursor to the conductive film to be deposited. Typically, the precursor is a metal ion or other metal source in a positive oxidization state with respect to the elemental metal. A common example of a metal source is a soluble metal salt containing ions of the metal (or metals) to be deposited electrolessly. If the deposited metal is copper, for example, then the salt is a copper salt such as copper sulfate, cupric chloride, copper pyrophosphate, etc. The concentrations of these compounds preferably range between about 0.5 g/L and 20 g/L, more preferably between about 1 g/L and 5 g/L. If the deposited metal is cobalt, then the salt is a cobalt salt such as cobalt (II) chloride or cobalt (II) sulfate. The concentrations of these compounds preferably range between about 0.01 M and 0.5 M, more preferably between about 0.05 M and 0.1 M. If the deposited metal is nickel, then the salt is a nickel salt such as nickel sulfate or nickel chloride. The concentrations of these compounds preferably range between about 0.01 M and 0.5 M, more preferably between about 0.05 M and 0.1 M.

Generally, though not necessarily, the metal source solution is an aqueous solution. In addition to the solvent and the metal source itself, the solution may include one or more other components such as a complexing agent for preventing metal ions from forming insoluble precipitates. The amount of complexing agent added to the electroless bath is a function of the concentration of copper salt in the metal source solution. Generally, the amount of complexing agent should be sufficient to complex all of the metal ions initially present in the solution (except as defined by the stability of the product of metal ion and the complexing agent). Thus, the molar amount of complexing agent should be comparable to, or slightly in excess of, the molar amount of metal ion.

Other optional components for the metal source solution include a pH adjuster and one or more surfactants and/or stabilizers. Still other additives (optional) include cyanide and certain metal salts such as salts of lead and arsenic that modify the plating surface by adsorbing thereto.

Preferably, the metal source solution does not contain significant amounts of reducing agent that could react with the metal source and allow unchecked bulk growth on the substrate surface. Thus, the metal source solution should contain significantly less reducing agent than would be required to stoichiometrically convert the metal source in solution to elemental metal. Preferably, the metal source solution is substantially free of reducing agent for the metal to be plated; preferably less than about 1 weight percent reducing agent.

Considerations for selecting a reducing agent include the rate of reaction and stability of the solution at a given temperature as well as the toxicity of the chosen agent. Note that the reducing agent provides the chemical driving force for reduction of metal ions from the metal source to neutral metal deposited on the substrate surface. The chosen reducing agent should provide a consistent and reasonably fast rate of reaction at a relatively low temperature. The reducing agent should readily give up electrons at the substrate surface. Unfortunately, many strong reducing agents appear ineffective for this purpose.

For copper deposition, aldehyde-containing compounds have been determined to give good results. Examples include glyoxylic acid and formaldehyde. A particularly preferred reducing agent is glyoxylic acid, which includes aldehyde and carboxylic acid moieties. Preferably, the aldehyde-containing reducing agent is provided at a molar concentration of between about 0.01 and 0.2 moles/L (M); more preferably between about 0.02 M and 0.1 M. For cobalt deposition, suitable reducing agents include hydrazine, dimethylamine borane (DMAB) and ammonium hypophosphite ($NH_4.H_2PO_4$). For cobalt deposition, the concentration of the reducing agent is preferably between about 0.01 M and 0.2 M, and more preferably between about 0.05 M and 0.1 M.

Preferably, the reducing agent solution does not contain significant amounts of metal source that could react with the reducing agent and lead to unchecked bulk growth on the substrate surface. To this end, the reducing agent solution should contain significantly less metal source than would be required to stoichiometrically consume the reducing agent in solution and form elemental metal. Preferably, the reducing agent solution is substantially free of metal ions for the metal to be plated; preferably less than about 1 weight percent salt(s) of such metal ions.

Generally, though not necessarily, the reducing agent solution is an aqueous solution. In addition to the solvent and the reducing agent itself, the solution may include one or more other components such a pH adjuster and one or more surfactants and/or stabilizers.

If used, surfactants can be added to either the reducing agent solution or the metal source solution, or even the deionized water or some other separately added component. Surfactants serve to modify grain structure, improve wetting, improve solution stability, and help displace evolved hydrogen gas. Examples of the suitable surfactants include PEG, PPG, triton X-100, RE610, and the like. In one specific embodiment, polyethylene glycol serves as a surfactant. The "Triton" surfactants available from Rohm and Haas of Philadelphia, Pa. and RE610 available from Rhone Poulenc of Cedex France have been found work as suitable surfactants.

In one preferred embodiment, the concentration of polyethylene glycol in solution ranges up to about 1000 ppm, more preferably between about 100 and 500 ppm. Generally, the surfactant should be added in an amount sufficient to meet the desired goals (e.g. good wetting, solution stability, etc.). Note that one of the principal difficulties observed in electroless deposition of copper is blistering caused by accumulated hydrogen at the interface within the deposit. The addition of surfactants to the plating bath seems to reduce the incidence of and severity of hydrogen-based blistering.

For most electroless baths employed with this invention an alkaline pH is employed. This allows for a negative free energy of the plating reaction, which can be achieved when the half-cell reaction for the reduction reaction $Cu^{2+} \rightarrow Cu(O)$ requires less energy than the half cell reaction for the oxidation reaction (e.g., glyoxylic acid→glyoxylate). The energy required for the reduction reaction varies with pH due to complexation and other factors such that the overall reaction becomes favorable only at alkaline pH values.

Thus, in preferred embodiments of this invention, the pH of the electroless plating solutions is greater than 7. More preferably, the plating bath pH lies between about 8 and 13 (most preferably between about 8 and 12). To adjust the pH, hydroxide is added to the aqueous electroless metal source solution. For IC fabrication applications, hydroxide is added in a form that does not include lithium, sodium, or potassium ions (or other ion that can be detrimental to semiconductor device performance). Beyond this, the exact nature of the pH adjuster is not critical to the performance of this invention. For IC fabrication, tetramethyl ammonium hydroxide or other alkali metal-free compound is desired.

At the relatively high pH is required for effective electroless plating, it is possible that metal ions in solution may precipitate out as insoluble metal hydroxide. Obviously, precipitated metal is unavailable for electroless plating on to substrate surfaces. Therefore, steps can be taken to ensure that metal ions remain soluble at the relatively high pHs employed with the electroless baths of this invention. To this end, the metal source solution preferably includes a complexing agent, as indicated above. Any complexing agent capable of acting as a ligand for metal ions will be suitable. Suitable examples for copper include ethylenediamine tetraacetic acid (EDTA), pyrophosphate, ethylenediamine, and the like. EDTA is a particularly preferred complexing agent for use with this invention.

2. Temperature

Temperature is another parameter that can strongly impact the rate of electroless deposition. In a preferred embodiment, the temperature of the electroless solutions is held at a temperature or relatively narrow range of temperatures between about 20 and 90 degrees C., more preferably between about 25 and 80 degrees C.; and most preferably between 40 and 70 degrees C. In a specific embodiment, the above plating solutions are used at a temperature of about 40 C. Preferably, both solutions are heated to approximately the same temperature prior contacting the substrate surface. Optionally, the substrate itself may be heated.

3. Metal Layers

As indicated above, the sequential electroless processes of this invention deposit a limited amount of metal during each cycle. Thus, the process typically involves multiple cycles, each depositing a small sub-layer of metal. This plating process finds particular value when very thin layers of conductive material—on the order of tens or hundreds of angstroms—are to be formed. By depositing only a very thin layer of material on each cycle—limited essentially by the amount of reactant adsorbed on the substrate surface—the invention allows easy and accurate control of the plated thickness. It also causes the resulting film's overall microstructure to be dense and compact compared with that of films generated by batch processes.

The process may be characterized on the basis of both a sub-layer thickness attained during each cycle and a total thickness representing the sum of the sub-layers deposited over the course of the entire process. Generally the term "metal layer" or metal "sub-layer" refers to a thin conformal or reasonably conformal film of metal residing on a substrate surface. During each cycle, the deposited metal sub-layer is very thin, on the order of 1 to 50 atomic layers.

In some cases, the metal sub-layer formed during each cycle is a "monolayer" in thickness. In such cases, if only a single deposition cycle is performed, the total thickness of the metal layer is only a monolayer.

As used herein, the term monolayer refers to a quantity of metal atoms (or other chemical entity such as a reducing agent compound) that fills available sites on a surface. The number of atoms or molecules per unit of surface area is a function of numerous factors such as the physico-chemical properties of available sites, steric features of the atoms/molecules (that might exclude atoms/molecules from adjacent sites), and orientation of atoms/molecules adhered to the surface.

Monolayers are essentially a single layer (or slightly more than a single layer) of atoms or chemical molecules on a surface. Such monolayers are thermodynamically distinct from atoms or chemical compounds existing in a bulk state.

Note that the invention is not limited to deposition of single monolayers in each precursor deposition cycle. Essentially any thickness of precursor molecule may be employed: monolayers, bilayers, trilayers, etc. In many cases, the amount of precursor deposited is simply the amount that adsorbs to the substrate surface under a particular set of conditions. The steady state quantity of precursor adsorbed under these conditions is referred to as a "saturated" layer. As explained below, certain physical conditions (e.g. temperatures, concentrations, substrate conditions) support only a monolayer of adsorbed precursor. More frequently, the saturated layer contains slightly less or somewhat more than a monolayer.

The total thickness of the electroless deposited layer will vary depending upon the needs of the particular process. Generally, thicknesses of interest will range between about 50 and 1000 angstroms. For many seed repair embodiments, the electroless deposited copper will have a thickness in the range of about 30-300 Angstroms, more preferably in the range of about 50-125 Angstroms. For other applications, the deposited metal layer may be slightly thicker.

Note that this application refers to deposition of "metal" layers such as "copper" layers, "cobalt" layers, and "nickel" layers. The use of any of these terms herein refers to pure elemental metal as well as various metal alloys such as copper-aluminum alloys, nickel-cobalt alloys, etc. Generally, to qualify as a copper layer, the material should contain at least about 50% atomic copper. Similar constraints apply to cobalt layers, nickel layers, etc. Note that some electroless deposition processes of this invention generate composite metal layers that separately deposit different metals on the substrate surface.

4. Delivery Conditions

Generally, the delivery conditions should be set to ensure sufficient (but not excess) amounts of chemical for each process operation. For many embodiments, this means that the solutions should be delivered in a manner ensuring that the substrate surface is saturated with reactant—or that at least a monolayer of reactant adsorbs on the surface.

Reactant solutions can be delivered by various mechanisms including (1) temporary immersion of the substrate in reactant solutions, (2) flowing different reactant solutions over the substrate surface (essentially changing bath chemistry over time), and (3) spin coating a rotating substrate with small amounts of the reactant solutions.

Obviously, the amount of reactant delivered depends on a number of factors, and these factors vary widely from application to application. The factors include the concentration of reactant solution, the size and geometry of the substrate surface to be plated, and the thickness of the layer to be plated per cycle (monolayer vs. sub monolayer, etc.).

In a preferred embodiment, the delivery mechanism is spin coating. In this procedure, individual reactant solutions are emitted from injectors at defined flow rates for defined periods of time. For a typical silicon wafer substrate (e.g., about 200 to 300 millimeter diameter with sub-micron topological features), the injection time of each component preferably ranges from a few milliseconds to a few seconds. More specifically, the injection time of the metal source solution preferably ranges between about 0.1 seconds and 10 seconds, and more preferably between about 0.5 seconds and 1 seconds. The flow rate preferably ranges between about 0 and 100 milliliters/second, and more preferably between about 0 and 10 milliliters/second. Similar times and flow rates are appropriate for the reducing agent solution.

Further, in order to achieve uniform deposit thickness across the wafer surface, the temperature and flow conditions should be consistent at each point on the wafer surface. In the cases where a substrate is immersed in a plating solution, this is best achieved by ensuring that the plating solution is consistently well mixed. Hence a suitable electrolyte flow rate should be maintained across the substrate surface. To this end, the substrate may be rotated, the electrolyte may be separately agitated, and/or the electrolyte may be forced to flow over the substrate surface. In the case of spin coating, this is achieved by rotating the substrate and directing the fluid streams at an appropriate angle and location on the substrate.

Apparatus for Sequential Electroless Plating

Regardless of the actual type of apparatus employed, the process should supply the plating chemicals sequentially, particularly the metal source and reducing agent, instead of simultaneously. As indicated, the deposition process can take place over multiple cycles—by alternately supplying reducing agent and metal source to the substrate surface. The apparatus should allow for this. Further, the apparatus should not require a large quantity of plating solution.

A spin plating apparatus is one example of an apparatus that is suitable for the present invention. Other types of suitable apparatus include immersion type systems in which the substrate surface alternately contacts a reducing agent solution and a metal source solution. This may be accomplished by moving the substrate between a plurality of different baths—or holding the substrate in a single bath and passing different reactant solutions over its surface.

Figure 2:
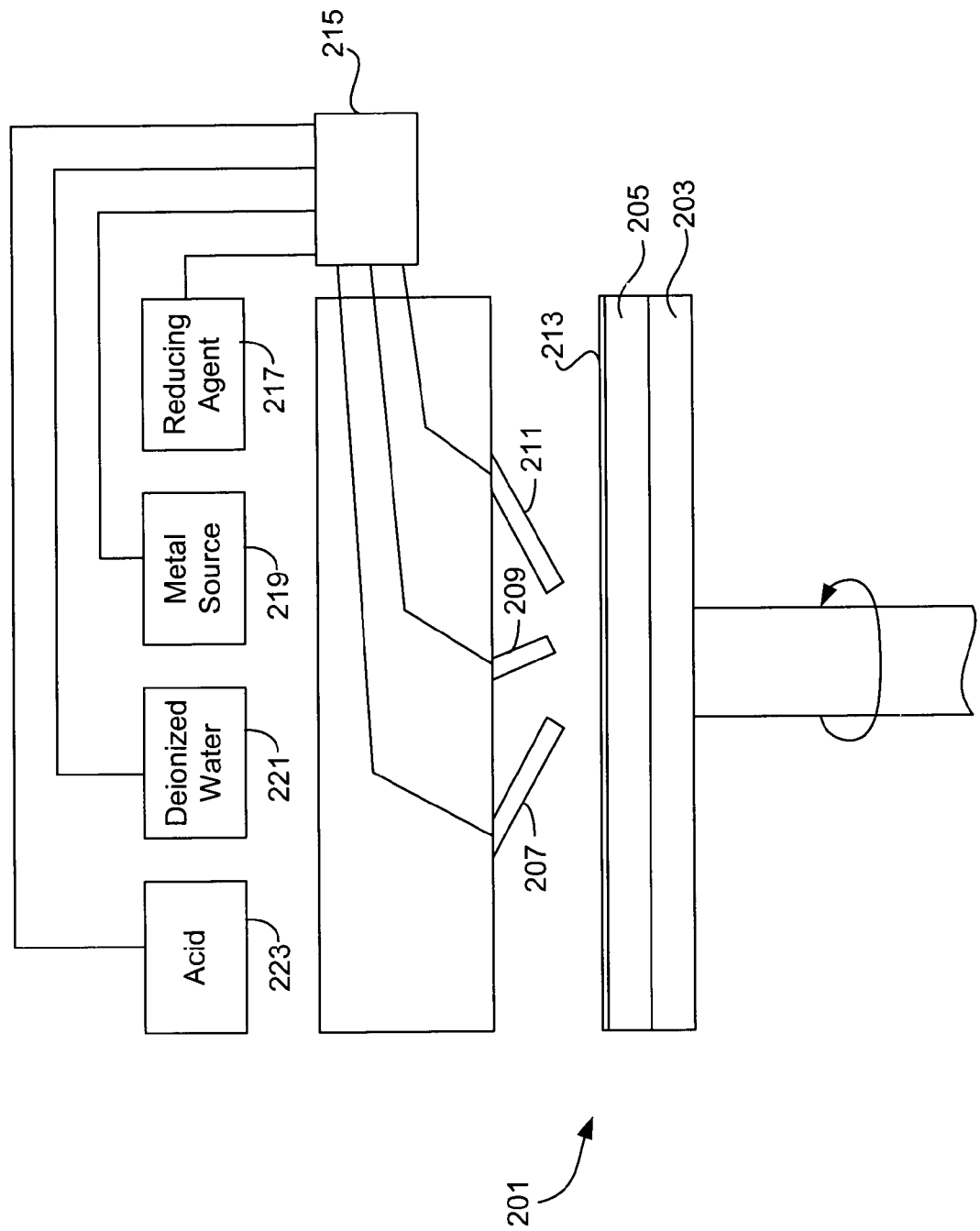
FIG. 2 is a diagram showing various components of a spin coating apparatus that may be employed to implement the sequential electroless deposition processes of this invention.

A spin coating system will now be described as one example of an apparatus used to conduct sequential electroless plating. FIG. 2 illustrates in very simple fashion the components of a spin coating apparatus, in accordance with one embodiment of this invention.

As depicted, a sequential electroless plating apparatus 201 includes a substrate holder 203 for positioning a substrate such that a substrate 205 can receive the reactant solutions necessary for electroless plating of a metal layer. Apparatus 201 includes one or more delivery mechanisms for providing separate solutions of at least (i) a reducing agent solution, and (ii) a metal ion solution to the substrate surface. In the depicted embodiment, the apparatus also provides deionized water and acid. Three injection nozzles 207, 209, and 211 are depicted. At the time of the depiction, injectors 207 and 209 are delivering liquids onto spinning substrate 205. In one example, the delivered fluids are deionized water from injector 209 and reducing agent solution from injector 209. At other times during operation, metal source solution may be delivered from injector 211, while deionized water is delivered from injector 209, and no reducing agent solution is delivered from injector 207. At earlier stages of the process, acid solution may be delivered via injector 209. Note that the injected fluid forms a liquid layer 213 evenly distributed over the substrate surface. At the appropriate time, the reducing agent and the metal ion react to electrolessly plate a metal layer on the substrate surface.

The depicted apparatus 201 also includes a control system 215 designed or configured to cause alternate delivery of the reducing agent solution and the metal source solution to the substrate surface. In one embodiment, the reducing agent solution is delivered prior to delivery of the metal ion solution during each cycle. The control system 215 is preferably an electronic system that precisely controls delivery times of acid, deionized water, and the reactant solutions. It may also control the fluid flow rates, delivery angles, number of cycles, etc. It can operate according predetermined settings or operate adjustably depending upon feedback data received from the apparatus.

The apparatus 201 also includes various sources of liquids, including a source of reducing agent 217, a source of metal ions 219, a source of deionized water 221, and a source of acid (e.g., dilute sulfuric acid) 223. The lines from these various components have valves, pumps, and/or other flow control elements operating under control of system 215.

Applications of Sequential Electroless Deposition

As indicated previously, this invention provides metal films on substrate surfaces. Generally, a "substrate" is any solid material on which a metal layer is to be formed in accordance with this invention. The substrate may be homogeneous or heterogeneous chemically or structurally over a scale of nanometers to micrometers. The invention is particularly valuable when the substrate has various gaps or recesses on its surface. Small gaps on the order of a micron or hundred nanometers or even tens of nanometers are particularly difficult to conformally cover by conventional deposition techniques. The present invention is particularly good at conformal deposition of metal within such features. It even works with high aspect ratio features having aspect ratios of 5:1 or greater.

One commercially important application of the present invention involves deposition of thin metal layers on a semiconductor substrate such as a partially fabricated integrate circuit—typically provided as one of many such integrated circuits on a semiconductor wafer (e.g., a single crystal silicon wafer). Commonly, the semiconductor substrates for use with this invention possess a particular exposed material on which the metal layer is to be deposited. Frequently encountered examples of these exposed materials include diffusion barrier layers, adhesion layers, dielectric layers, etc.

A "semiconductor wafer" as discussed in this document is a semiconductor substrate at any of the various states of manufacture/fabrication in the production of integrated circuits. One standard semiconductor wafer described in this invention is a silicon wafer 200 mm in diameter, 0.75 mm thick, with an approximate radius of curvature of about 0.15 millimeters (see SEMI Specification M1-0298). Of course, semiconductor wafers of other dimensions, such as standard 300 mm diameter silicon wafers, can also be processed in accordance with this invention. Note that standard specifications for a 300 mm diameter wafer may be found in SEMI Specification M1.15-0997.

While the present invention can be employed to assist in formation of seed layers, barrier layers, or capping layers on any appropriate substrate surface, it is, as indicated, particularly advantageous when used with substrates having high aspect ratio, small width openings, where good step coverage is essential. Trenches and vias in integrated circuit fabrication are good examples of such openings. In particularly preferred embodiments, the invention is employed with semiconductor wafer surfaces having trenches and/or vias (or any type of Damascene structure) of aspect ratio about 4:1 or greater; more preferably about 6:1 or greater. Further, the smallest among these features preferably have a width of not greater than about 0.2 micrometers; more preferably not greater than about 0.1 micrometers. Usually, there will be a range of feature sizes on a given pattern. The smaller features may be as small as 0.05 to 0.3 micrometers in width. Larger features may be several micrometers in size.

Such features/recesses are often formed on dielectric layers of partially fabricated integrated circuits. As indicated above, Damascene processes typically require formation of a seed layer and a barrier layer. Thus, the present invention finds particular applicability in Damascene processes for fabricating integrated circuits.

A Damascene process generally proceeds as follows. Damascene processes provide inlaid copper lines in dielectric layers of integrated circuits. The copper lines provide electrical routing between circuit elements in the integrated circuit. In a Damascene process, both copper lines and vias are provided in horizontal layers of dielectric. A typical Damascene process begins by patterning an etch-resistant photoresist on a previously deposited layer of dielectric on a wafer face. Thereafter, trenches defining the horizontal copper routing are etched into the dielectric surface to a specified depth. The depth does not extend the whole way through the dielectric to underlying conductive features in a lower level metal layer or in the silicon substrate.

After the trenches have been etched, the photoresist is removed and a new etch resistant photoresist is deposited. This new layer of photoresist defines a via pattern in the dielectric of the wafer face. The vias are subsequently etched through the dielectric to the underlying metal lines or circuit elements. The vias provide a pathway between conductive features on different layers of the integrated circuit. After etching the vias, the photoresist is removed.

At this point, trenches and vias have been etched into the dielectric, but no conductive lines or interconnects have been added. In most implementations of the Damascene process, copper lines and interconnects are formed primarily by electrodeposition. But electrodeposition cannot commence unless there is an electrically conductive surface that can serve as a cathode onto which copper can deposit. Obviously, the electrically insulating dielectric layer is an inadequate cathode. To allow electrodeposition, a conductive surface must be provided over the surface of the dielectric layer and within the trenches and vias.

In addition, a diffusion barrier must be provided on the surface of the dielectric to prevent copper from diffusing into the dielectric surface. If copper were to diffuse into dielectric material, the dielectric layer's insulating properties would be compromised and the integrated circuit could fail.

With these goals in mind, the Damascene process typically employs physical vapor deposition (PVD) of first a diffusion barrier layer and then a copper seed layer. Conventionally, these layers are deposited in succession into vias and routing lines, pre-etched in dielectric surfaces. Many suitable barrier layers may be employed such as tantalum, titanium nitride, etc. The copper seed layer serves as a conductive substrate unto which bulk copper may be electrodeposited. The seed layer is a thin layer (typically 800-2000 angstroms nominal) that covers the entire face of the wafer, following the sharp contours of the recessed features. In one embodiment of this invention, the sequential electroless deposition process provides a dual function barrier-seed layer of cobalt, nickel-cobalt alloy, or cobalt-tungsten alloy. In this variation on the conventional Damascene process, there is no need to deposit the barrier layer and/or the seed layer by PVD.

With the barrier and seed layers in place, the electroplating operation can begin. Electroplating fills the etched vias and trenches with copper and continues until the copper forms a continuous sheet over the entire wafer surface. Thereafter, the top portion of the copper is removed from the wafer face to expose the unetched regions of the dielectric layer and leave copper-filled interconnect circuitry. At this point, a capping layer may be applied using the sequential electroless plating operation of this invention. This involves depositing a capping layer comprised of CoBP, CoP, CoB, CoWP, NiP, NiPW, CoBPW or similar material. Phosphorus can be integrated into the electroless layer from using the reducing agent ammonium hypophosphite.

One limitation of the general Damascene process sequence is the difficulty in achieving a continuous PVD copper seed layer within high aspect ratio features without causing the features to close off at the top. Understand that as greater and greater quantities of copper seed are deposited by PVD, more complete coverage within a deep feature is attained. One application of the present invention is "seed repair," wherein sequential electroless plating is used to "fill in" the PVD seed layer at locations where there are gaps or poor coverage.

Of course, this invention is not limited to Damascene processes or even to integrated circuit fabrication applications. In a different industrial application, the entire conductive copper circuitry of a circuit board is formed by sequential electroless deposition. In its process, the ability of electroless copper to deposit conformally on all geometric surfaces is utilized to yield relatively uniform thickness distributions over the surface. The conventional version of this process is described in U.S. Pat. No. 4,152,467, which is incorporated herein by reference for all purposes. In a related process, copper is first sputtered or evaporated on printed circuit board and then deposited by electroless plating. See U.S. Pat. No. 5,576,052 to Arledge et al., which is incorporated herein by reference for all purposes.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming a metal layer on a surface of a partially fabricated semiconductor device substrate, the method comprising
    (a) contacting the surface of the semiconductor device substrate with a liquid reducing agent solution, wherein the reducing agent solution comprises insufficient metal ion to permit electroless plating of the metal;
    (b) contacting the surface of the semiconductor device substrate with a liquid metal ion solution, wherein the metal ion solution comprises insufficient reducing agent to permit electroless plating of the metal, whereby the metal ion reacts with the reducing agent at the substrate surface to electrolessly plate the metal on the substrate surface; and
    (c) repeating (a) and (b) one or more times to gradually build up the metal layer, wherein each repetition of (a) and (b) generates a thin metal layer, on the order of about 1 to 50 atomic layers.

2. The method of claim 1, wherein the reducing agent solution is substantially free of the metal ions.

3. The method of claim 1, wherein the reducing agent solution comprises a reducing agent selected from the group consisting of glyoxylic acid, formaldehyde, hydrazine, dimethylamino borane, and ammonium hypophosphite.

4. The method of claim 1, wherein the reducing agent solution comprises reducing agent in a concentration ranging from between about 0.01 M to about 0.2 M.

5. The method of claim 1, wherein the metal ion is copper ion and the reducing agent is selected from the group consisting of glyoxylic acid and formaldehyde.

6. The method of claim 1, wherein the metal ion is cobalt ion and the reducing agent is selected from the group consisting of hydrazine, dimethylamineborane, and hypophosphite.

7. The method of claim 1, wherein the reducing agent solution contacts the substrate surface in a manner causing a saturated layer of reducing agent to adsorb to the substrate surface.

8. The method of claim 1, wherein the partially fabricated semiconductor device has comprises features having a principal dimension of at most about 1 micrometer.

9. The method of claim 1, wherein the metal layer comprises a seed layer for a Damascene structure.

10. The method of claim 1, wherein the metal layer comprises barrier-seed layer.

11. The method of claim 1, wherein the metal layer comprises a capping layer provided on top of a copper or aluminum conductive line.

12. The method of claim 11, wherein the capping layer comprises a material selected from the group consisting of Co, Cop, CoB, CoBP, CoBPW, CoWP, Ni, NiP, NiPW, and combinations thereof.

13. The method of claim 1, wherein the metal ion source comprises a salt of the metal ion.

14. The method of claim 13, wherein the metal ion is selected from the group consisting of cobalt, copper, nickel, and combinations thereof.

15. The method of claim 1, wherein the metal ion solution comprises metal ions in a concentration of between about 0.01 M and 0.5 M.

16. The method of claim 1, further comprising:
(d) contacting the substrate surface with a second reducing agent solution, wherein the reducing agent solution comprises insufficient concentration of a second metal ion to permit electroless plating of the second metal; and
(e) contacting the substrate surface with a solution of the second metal ion, whereby the second metal ion reacts with the second reducing agent on the substrate solution to electrolessly plate the second metal on the substrate surface.

17. The method of claim 1, further comprising contacting the substrate surface with deionized water.

18. The method of claim 1, wherein each repetition of (a) and (b) generates approximately one monolayer of metal.

19. A method of forming a metal layer on a surface of a partially fabricated semiconductor device substrate the method comprising
(a) delivering a liquid reducing agent solution to the surface of a semiconductor device substrate to cause said reducing agent to adsorb to the substrate surface;
(b) stopping or reducing delivery of the reducing agent solution to the substrate surface;
(c) delivering a liquid metal ion solution to the substrate surface, whereby the metal ion reacts with the adsorbed reducing agent at the substrate surface to electrolessly plate the metal on the substrate surface; and
(d) repeating (a) through (c) one or more times to gradually build up the metal layer, wherein each repetition of (a) through (c) generates a thin metal layer, on the order of about 1 to 50 atomic layers.

20. A method of forming a metal layer on a surface of a partially fabricated semiconductor device substrate, the method comprising
(a) delivering a metal source solution to the surface of a semiconductor device substrate to cause said metal source to adsorb to the substrate surface;
(b) stopping or reducing delivery of the metal source solution to the substrate surface;
(c) delivering a reducing agent solution to the substrate surface, whereby the reducing agent reacts with the adsorbed metal source at the substrate surface to electrolessly plate the metal on the substrate surface;
(d) repeating (a) through (c) one or more times to gradually build up the metal layer, wherein each repetition of (a) through (c) generates a thin metal layer, on the order of about 1 to 50 atomic layers, wherein repeating (a) comprises contacting the metal source solution to the metallic layer on the substrate.

21. The method of claim 20, wherein each repetition of (a) through (c) generates approximately one monolayer of metal.

22. A method of forming a composite metal layer on a surface of a semiconductor device substrate, the method comprising
(a) contacting the semiconductor device substrate surface with a liquid reducing agent solution, wherein the reducing agent solution comprises insufficient metal ion to permit electroless plating of the metal;
(b) contacting the substrate surface with a liquid first metal ion solution, wherein the first metal ion solution comprises insufficient reducing agent to permit electroless plating of the first metal, whereby the first metal ion reacts with the reducing agent at the substrate surface to electrolessly plate a first metal layer on the substrate surface;
(c) contacting the substrate surface with a liquid reducing agent solution, wherein the reducing agent solution comprises insufficient metal ion to permit electroless plating of the metal; and
(d) contacting the substrate surface with a liquid second metal ion solution, wherein the second metal ion is a different than the first metal ion and the second metal ion solution comprises insufficient reducing agent to permit electroless plating of the metal, whereby the second metal ion reacts with the reducing agent at the substrate surface to electrolessly plate the second metal on the first metal layer.

23. The method of claim 22, further comprising repeating (a) through (d) one or more times to gradually build up the composite metal layer, wherein each repetition of (a) and (b) and each repetition of (c) and (d) generates a thin metal layer, on the order of about 1 to 50 atomic layers.

* * * * *